(12) United States Patent
Slezak

(10) Patent No.: US 8,878,590 B2
(45) Date of Patent: Nov. 4, 2014

(54) TECHNIQUES FOR SWITCHING BETWEEN AC-COUPLED CONNECTIVITY AND DC-COUPLED CONNECTIVITY

(71) Applicant: TranSwitch Corporation, Shelton, CT (US)

(72) Inventor: Yaron Slezak, Raanana (IL)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/745,011

(22) Filed: Jan. 18, 2013

(65) Prior Publication Data

US 2013/0187699 A1    Jul. 25, 2013

Related U.S. Application Data

(60) Provisional application No. 61/590,647, filed on Jan. 25, 2012.

(51) Int. Cl.
*H03L 5/00* (2006.01)
(52) U.S. Cl.
USPC .............................................. 327/333; 326/30
(58) Field of Classification Search
USPC .......................................... 327/333; 326/30
See application file for complete search history.

(56) References Cited

U.S. PATENT DOCUMENTS

| 7,102,390 | B2 * | 9/2006 | Frans et al. ...................... 326/82 |
| 8,035,424 | B2 * | 10/2011 | Komatsu et al. ............... 327/108 |
| 2004/0123197 | A1 * | 6/2004 | Sunter et al. ................... 714/724 |
| 2006/0290426 | A1 * | 12/2006 | Chen et al. ...................... 330/253 |

* cited by examiner

*Primary Examiner* — Kenneth B. Wells
(74) *Attorney, Agent, or Firm* — Pearl Cohen Zedek Latzer Baratz LLP

(57) ABSTRACT

A circuit for switching between an AC-coupled connectivity and DC-coupled connectivity of a multimedia interface. The circuit comprises a current source connected in series to a wire of the multimedia interface and a coupling capacitor; and a termination resistor connected to the current source and to the coupling capacitor, wherein the circuit is connected in series between a source line driver and a sink line receiver of the multimedia interface, wherein the source line driver supports both the AC-coupled connectivity and the DC-coupled connectivity and the sink line receiver supports any one of the AC-coupled connectivity and the DC-coupled connectivity, wherein the current source and the termination resistor allows the setting of voltage levels of signals received at the sink line receiver to voltage levels defined by the multimedia interface thereby to switch to the coupling connectivity type required by the multimedia interface at which the sink line receiver operates.

20 Claims, 4 Drawing Sheets

TECHNIQUES FOR SWITCHING BETWEEN AC-COUPLED CONNECTIVITY AND DC-COUPLED CONNECTIVITY

CROSS REFERENCE TO RELATED APPLICATIONS

The application claims the benefit of U.S. provisional application No. 61/590,647 filed Jan. 25, 2012, the contents of which are herein incorporated by reference.

TECHNICAL FIELD

This invention generally relates to electronic display device connectivity, and more particularly to enabling AC-coupled and DC-coupled connectivity.

BACKGROUND

The high-definition multimedia interface (HDMI™) is a licensable compact audio/video connector interface for transmitting uncompressed digital streams. The HDMI connects a digital audio/video (or multimedia) source device to a compatible digital audio device and/or a video monitor such as a digital television. In contrast to consumer analog standards, the HDMI enforces digital rights management (DRM) on transmitted media.

Another industrial standard digital multimedia interface is a DisplayPort™ (DP). DisplayPort™ (or DP) is another example for a standard that defines a digital display interface of a digital audio/video interconnect. The DP is intended to be used primarily between a computer and its display monitor, or a computer and a home-theater system.

The Universal Serial Bus (USB) is another connectivity standard primarily utilized to establish communication between devices and a host controller of a PC. However, the USB has also become commonplace on handheld devices, such as mobile phones, smart phones, PDAs, tablet computers, camcorders, and video game consoles. Other interface standards that define the digital display interfaces of a digital audio/video interconnect for handled devices have been recently defined. Examples for such interface standards include the mobile high-definition link (MHL) and Mobility DisplayPort™ (or MyDP).

All of the above connectivity standards provide an interface between a source device and a sink device by proprietary cable and connectors. The source device may be, for example, a set-top box, a DVD player, a personal computer, a video game console, a smart phone, etc., while the sink device may be, for example, a high-definition TV (HDTV). However, different standards can utilize different techniques for interconnecting two circuits, i.e., a line driver and a line receiver. A line driver drives the multimedia signal (Video/Audio) via one of the two coupled circuits, i.e., AC-coupled or DC-coupled. A line receiver is connected in the sink device and is configured to receive multimedia signals.

Specifically, the connectivity of the digital multimedia source is realized through a cable that includes multiple channels. The signals over a channel are transported over a wire or over a pair of differential wires. The cable provides an interconnecting means that is either DC-coupled or AC-coupled.

FIG. 1A illustrates an AC-coupled connectivity between a line driver 110 and a line receiver 120 of source and sink devices respectively. The AC coupling requires placing a coupling capacitor 115 in series with the signal to be coupled. That is, the coupling capacitor 115 connects the source device's line driver 110 and the sink device's line receiver 120. Thus, only AC signals from the source line driver 110 can pass to the sink line receiver 120, while DC signals are blocked.

In contrast, a DC-coupled connectivity, depicted in FIG. 1B, does not require a coupling capacitor to connect the line driver 110 and the line receiver 120 of source and sink devices respectively. The DC signals flow between the multimedia source line driver 110 and sink line receiver 120. The DC levels of such signals, i.e., $V_H$, $V_L$, and $V_{COMMON-MODE}$, are set by the supply voltage of source and sink devices.

The AC-coupled connectivity allows, for example, isolating DC bias settings, and is widely used to transmit signals with a zero DC component, known DC-balanced signals. However, in order to reach a DC-balanced signal, a special coding is needed. This special coding requires redundancy bits and hence it increases the baud-rate to be transmitted.

Typically, a line driver (i.e., a line driver 110) is connected via an AC-coupled connectivity or a DC-coupled connectivity, with no ability to select the other coupling option for the same line driver and its data lines. For example, when a line driver is being used with an AC-coupled connectivity, the coupling capacitor 115 cannot be simply bypassed. The different multimedia digital interfaces discussed above utilize different coupling techniques. For example, an HDMI and an MHL are based on a DC-coupled connectivity, while the DisplayPort and USB implement an AC-coupled connectivity.

Therefore, to allow interoperability between different types of multimedia digital interfaces (e.g., HDMI and DisplayPort), there is a need to switch from an AC-coupled to a DC-coupled type of connectivity. One solution to achieve this aim is by means an external cable adaptor. Such an adaptor is typically realized as a dongle which is a repeater connected to the connector. However, an adaptor is an expensive solution in terms of cost and size of its circuits. In addition, the solution of external cable is a fixed solution and cannot dynamically change the type of connectivity. Another solution is to include a switch for bypassing the coupling capacitor 115, when transferring from an AC-coupled to a DC-coupled connectivity mode. However, at high frequency data transfer rates (e.g., Giga hertz rates), such a switch damages the signal integrity. In a multimedia interface, a typical data transfer rate is above 10 Gbps.

Thus, it would be advantageous to have an efficient solution for selecting between coupling connectivity techniques in digital multimedia interfaces.

SUMMARY

Certain embodiments disclosed herein include a circuit for switching between an AC-coupled connectivity and a DC-coupled connectivity of a multimedia interface. The circuit comprises a first current source connected in series to a first wire of the multimedia interface and a first tap of a first coupling capacitor; and a first termination resistor connected to the first current source and to the first tap of the first coupling capacitor, wherein the circuit is connected in series between a source line driver and a sink line receiver of the multimedia interface, wherein the source line driver supports both the AC-coupled connectivity and the DC-coupled connectivity and the sink line receiver supports any one of the AC-coupled connectivity and the DC-coupled connectivity, thereby the circuit switches to the coupling connectivity type required by the multimedia interface at which the sink line receiver operates, wherein the sink line receiver is connected to the first tap of the first coupling capacitor and the source line driver is connected to a second tap of the first coupling capacitor.

Certain embodiments disclosed herein also include a source line driver configured to drive multimedia signals of a multimedia interface. The source line driver comprises a current source; a termination resistor connected to the current source; and a circuit connected to a coupling capacitor and configured to switch between an AC-coupled connectivity and a DC-coupled connectivity to allow compatibility with the multimedia interface of a sink line receiver, wherein the source line driver supports both the AC-coupled connectivity and the DC-coupled connectivity and the sink line receiver supports any one of the AC-coupled connectivity and the DC-coupled connectivity, thereby the circuit switches to the coupling connectivity type required by the multimedia interface at which the sink line receiver operates.

BRIEF DESCRIPTION OF THE DRAWINGS

The subject matter that is regarded as the invention is particularly pointed out and distinctly claimed in the claims at the conclusion of the specification. The foregoing and other objects, features and advantages of the invention will be apparent from the following detailed description taken in conjunction with the accompanying drawings.

DETAILED DESCRIPTION

Figure 1A:
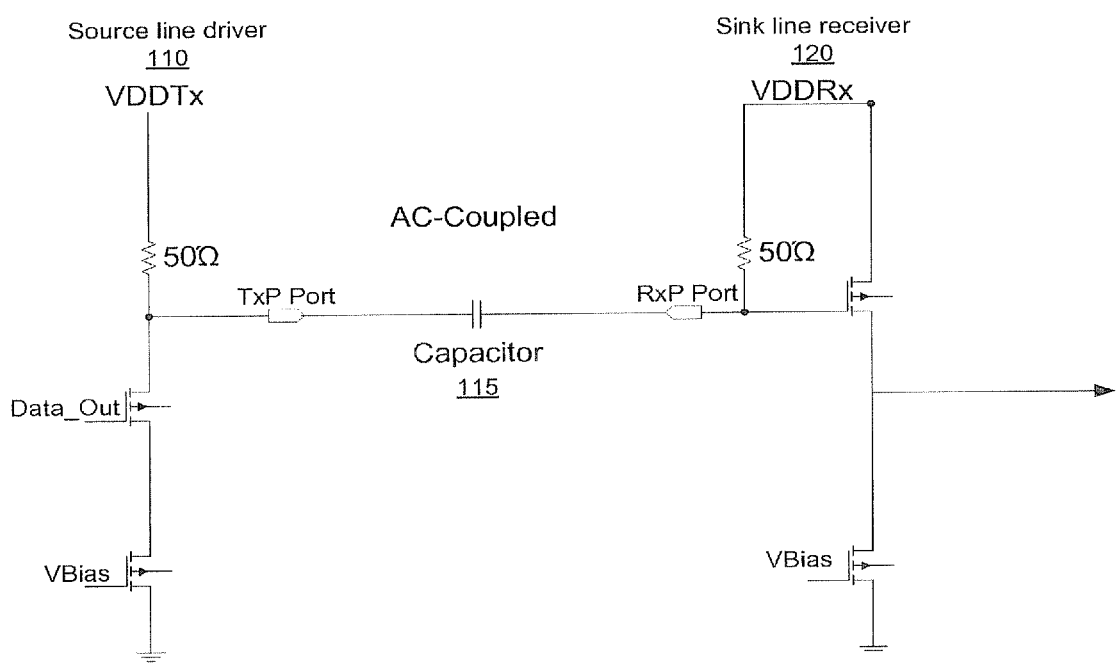
FIG. 1A is a schematic electric diagram of an AC-coupled connectivity.
Figure 1B:
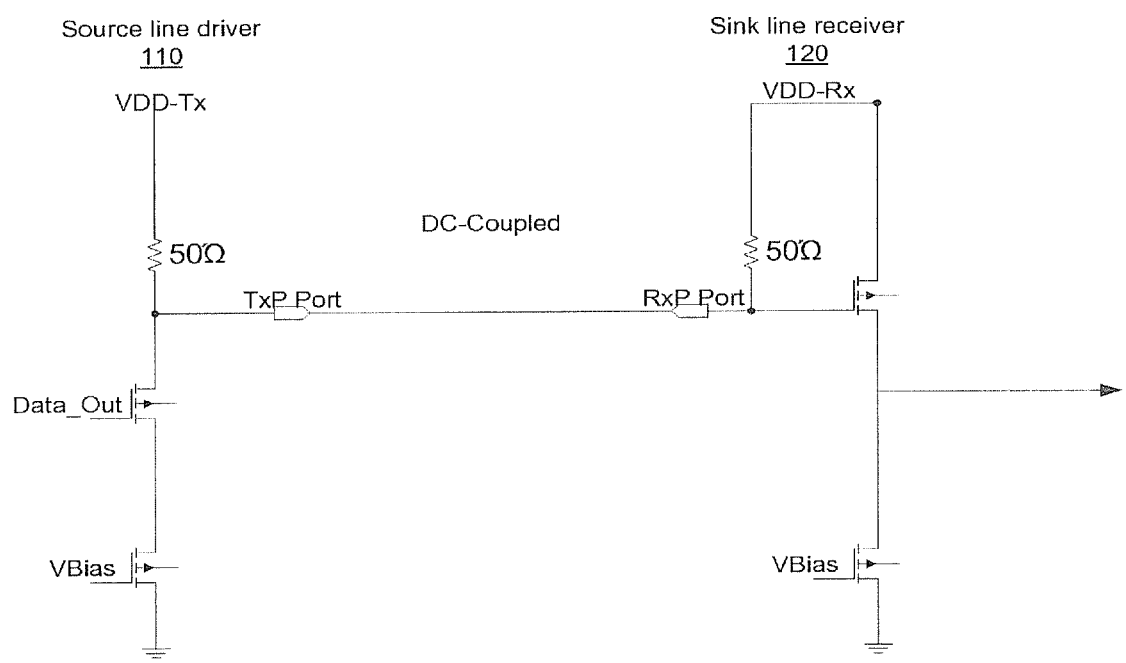
FIG. 1B is a schematic electric diagram of a DC-coupled connectivity.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

The various embodiments of the invention allow switching between DC-coupling and AC-coupling connectivity in multimedia interfaces. The disclosed embodiments allow for efficient operation of multimedia source and sink devices that are compatible with multimedia digital interfaces implementing different types of signal coupling. For example, a source device may be compatible with an HDMI and DisplayPort interface, which respectively implements DC-coupled and AC-coupled connectivity. In one embodiment, the type of the coupling is selected based on the multimedia interface at the sink device. That is, to the source device, either a DC-coupled or an AC-coupled sink device can be connected without using any cable adaptors (dongles) or a switch for bypassing a coupling capacitor. The source device can support both coupling types.

Figure 2:
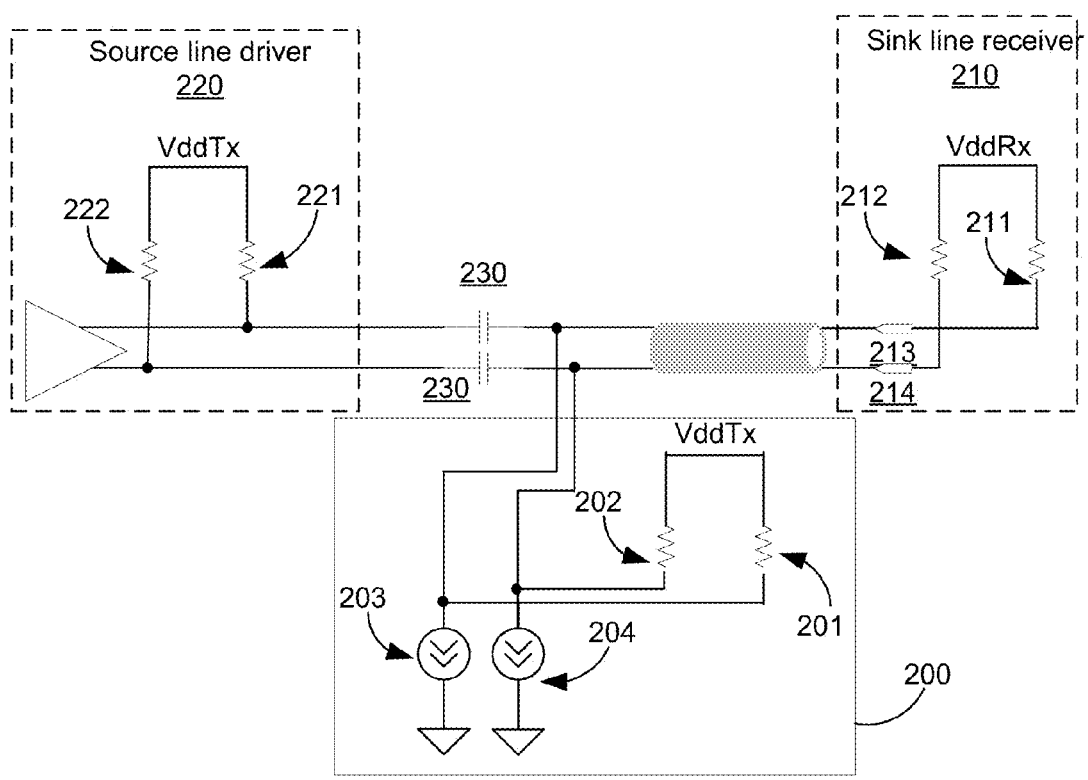
FIG. 2 is a schematic electric diagram of a circuit for switching between a DC-coupled and AC-coupled connectivity according to one embodiment.

FIG. 2 shows an exemplary diagram illustrating a circuit 200 designed to allow switching between AC-coupling and DC-coupling connectivity according to one embodiment. The circuit 200 is connected between a sink line receiver 210 and a source line driver 220 connected at a source device. In one embodiment, the circuit 200 is implemented in the source device and may be integrated in the line driver 220. The line driver 220 drives multimedia signals respective of one or more multimedia interfaces. A multimedia interface may be, for example, a HDMI, a DisplayPort, a USB, MyDP, MHL, and the like. As noted above, some of these interfaces may require a DC-coupling connectivity while others may require an AC-coupling connectivity.

In one embodiment, the circuit 200 provides interoperability between the different coupling techniques utilized by different multimedia interfaces. For example, the source line driver 220 may drive DisplayPort and HDMI signals, and the circuit 200 efficiently adapts the coupling type to support both types of interfaces, thus enabling proper reception of the multimedia signals at the line driver 220. In one embodiment, the circuit 200 may allow interoperability between different types of interfaces. In another embodiment, the circuit 200 may also provide backward compatibility between an interface of the same type that requires a DC-coupling connectivity and an AC-coupling connectivity at different implementations. The sink line receiver 210 and the source line driver 220 support any of the multimedia interfaces mentioned above.

In the diagram shown in FIG. 2, the sink line receiver 210 is connected to the source line driver 220 through a pair of differential wires 213 (for a positive signal) and 214 (for a negative signal). Each wire 213, 214 includes a coupling capacitor 230 connected in series between the line receiver 210 and the line driver 220. It should be noted that FIG. 2 depicts one channel of the multimedia interface, while each of the multimedia interfaces mentioned above includes multiple channels. However, the disclosed techniques can be easily adapted to any channel and any number of channels in a multimedia interface. It should be further noted that in the case of a single-ended connection (i.e., not differential pair) only one wire and one coupling capacitor are utilized.

The circuit 200 includes termination resistors 201 and 202 respectively connected to the current sources 203 and 204 as well as to wires 213 and 214. In one embodiment, each of the current sources 203 and 204 acts as a stub (which is a transmission line that is connected at one end only); therefore each is matched to a respective termination resistor 201 and 202, which may be a 50 Ohm termination.

According to one embodiment, the circuit 200 forms an AC-coupled connectivity that enables control of the DC voltage levels on the wires 213, 214. This is performed by sinking a DC current from sink termination resistors 211, 212 and from the termination resistors 201, 202 using current sources 203 and 204. The source line driver 220 may be, for example, a current-mode logic (CML) architecture, a voltage-mode (VM) architecture, and the like.

The DC current level of each of the current sources 203, 204 is programmable, thereby allowing control of the exact DC voltage levels on each wire 213, 214. Therefore, controlling the DC current levels of the sources 203, 204 allows setting the DC voltage levels on the wires 213, 214 to meet the requirements of the respective multimedia interface that implements a DC-coupled connectivity. It should be noted that because the difference between the AC-coupled and DC-coupled connectivity is the DC voltage levels (e.g., $V_H$, $V_L$, and $V_{COMMON-MODE}$), thus changing the DC voltage levels does behave as if they were DC-coupled.

Following is a description of the operation of the circuit 200 configured to switch between a DC-coupled and an AC-coupled connectivity. When the source line driver 220 is in an AC-coupled state, i.e., drives AC-coupled signals, the current sources 203, 204 are at "off-state". When the source line driver 220 drives DC-coupled signals, the current sources 203, 204 are at "on-state", and the DC voltage levels of the signals received at the sink line driver 210 are set as required by the multimedia interface at which the sink line receiver operates.

The circuit 200 by means of the current sources 203, 204 emulates a DC-coupled connectivity, thereby enabling the use of one line driver for various versions of the same multimedia interface that requires AC-coupled or DC-coupled connectivity. In addition, the circuit 200 by emulating a DC-coupled connectivity enables the use of one line driver for different multimedia standards that require AC-coupled or DC-coupled connectivity.

Figure 3:
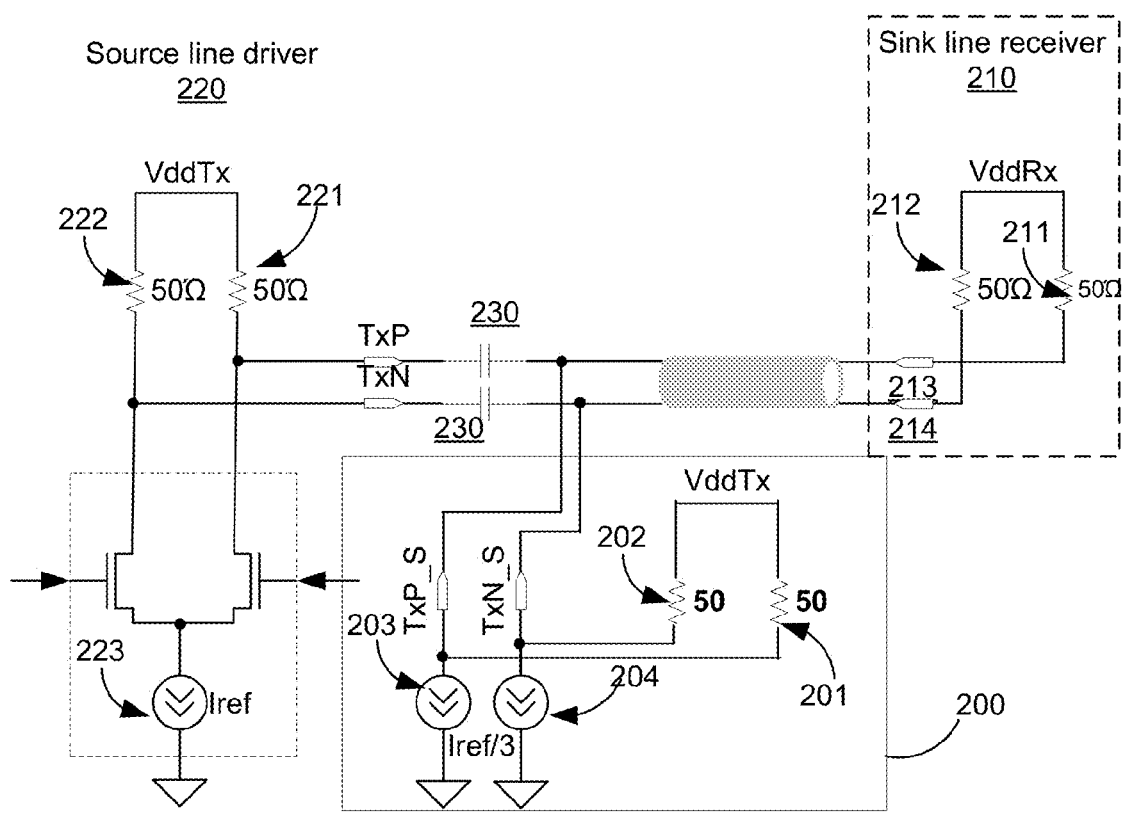
FIG. 3 is a schematic electric diagram illustrating the operation of the circuit shown in FIG. 2.

Following is a non-limiting example for the operation of the circuit 200. The example is described with a reference to FIG. 3. In this example, the source line driver 220 is implemented as a current-mode-logic (CML) driver. It should be noted, however, that the disclosed techniques are feasible to other line driver architectures, such as, but not limited to, voltage-mode (VM).

In this example, Iref/3 (i.e., Iref current value divided by 3) is the value of the current sources 203 and 204. Specifically, Iref is the current level generated by a current source 223 at the source line driver 220 and defines the required amplitude of the $V_{SWING}$ signal. Each of the current sources 203 and 204 is connected to two termination resistors. That is, the current source 203 is connected to resistors 211, and 201, while the current source 204 is connected to resistors 212, and 202. The current source 223 is connected to three termination resistors. That is, in order to drive signal (TxP), the current source 223 is connected to resistors 221, 211, and 201. To drive signal (TxN), the current source 223 is connected to resistors 222, 212, and 202. It should be noted that at high data transfer rates the coupling capacitors 230 act as a short. This is the case for multimedia interfaces where a typical data baud rate is above 10 Gbps, while the capacitor acts as a short at a transfer rate that is higher than 250 Mbps.

The current value Iref can be programmable to achieve the required amplitude ($V_{SWING}$), and the DC level requirements of the multimedia interface between the source and the sink devices. In a case of using an AC-coupled connectivity, then the current sources 203 and 204 are at their off state. Thus, the source line driver 220 drives a differential signal through the capacitors 230 from a source device (Tx) to a sink device (Rx).

The following example describes how the voltage level of the signals $V_H$ and $V_L$ received at the sink line receiver 210 depend on the Iref in the case of an AC-coupled connectivity. As noted above, in a case of an AC-coupled connectivity, the current sources 203 and 204 are active.

1. $V_H = V_{ddRx} + V_{SWING}/2 =$
$= V_{ddRx} + (\text{Resistance\_AC} * Iref)/2$
$= V_{ddRx} + (50 \text{ Ohm}/3 * Iref)/2 =$
$= V_{ddRx} + (16.6 \text{ Ohm} * 24 \text{ mA})/2$
$= 3.3v + 0.4v/2$
$= 3.3v + 0.2v$
$= 3.5v$ -continued 2. $V_L = V_{ddRx} - V_{SWING}/2$
$= 3.3v - 0.2v$
$= 3.1v$ $V_{COMMON-MODE} = (V_H + V_L)/2 = (3.5v + 3.1v)/2 = 3.3v$ $V_{SWING\_DIFF}(\text{peak-2-peak}) = 2*(16.6 \text{ Ohm}*Iref)$
$= 2*(16.6 \text{ Ohm}*24 \text{ mA})$
$= 0.8v$ The Resistance_AC is equivalent to a resistance value of three resistors connected in parallel to the current source 223. As noted above, the current source 223 is connected to resistors 221, 211, and 201, or to resistors 222, 212, and 202. In the example shown in FIG. 3, the value of each these resistors is 50 Ohm, thus the Resistance_AC value is 16.6 Ohm as three respective resistors are connected in parallel. Iref is the current level of the current source 223 connected to the source line driver 220 and in this example Iref=24 mA. $V_{ddRx}$ is the voltage level of a power source of the sink line receiver 210, and in this example $V_{ddRx}$=3.3V. $V_{SWING}$ is the peak-to-peak voltage level of a single-ended signal, and is equal to the (Resistance_AC*Iref) or to ($V_H-V_L$). The value $V_{SWING-DIFF}$ is the peak-to-peak voltage level of a differential signal. The voltage level $V_{SWING}$ in this example can be utilized in a DisplayPort interface which requires an AC-coupled connectivity.

In a case of using a DC-coupled connectivity, then each of the current sources 203, 204 is on and generates a current signal having a current level of Iref/3. The source line driver 220 drives a differential signal through the capacitors 230 from a source device (Tx) to a sink device (Rx).

The following example describes how the voltage level of the signals $V_H$ and $V_L$ received at the sink line receiver 210 depend on the Iref in a case of a DC-coupled connectivity. As noted above, in a case of an AC-coupled connectivity, the current sources 203 and 204 are active.

$V_H=V_{ddRx}+V_{SWING}/2-(\text{Resistance\_DC}*Iref/3)=V_{ddRx}+$
$(\text{Resistance\_AC}*Iref)/2-(50 \text{ Ohm}/2*Iref/3)=$
$V_{ddRx}+(50 \text{ Ohm}/3*Iref)/2-(25 \text{ Ohm}*Iref/3)=$
$V_{ddRx}+(16.6 \text{ Ohm}*24 \text{ mA})/2-(25 \text{ Ohm}*8$
$\text{mA})=3.3 v+0.4 v/2-0.2 v=3.3 v+0.2 v-0.2 v=$
$3.3 v(=V_{ddRx})$;                                             1.

$V_L=V_{ddRx}-V_{SWING}/2-(\text{Resistance\_DC}*Iref/3)=$
$3.3 v-0.2 v-0.2 v=2.9 v(=V_{ddRx}-V_{SW})$                     2.

$V_{COMMON-MODE}=(V_H+V_L)/2=(3.3 v+2.9 v)/2=3.1 v$             3.

$V_{SWING\_DIFF}(\text{peak-2-peak})=2*(16.6 \text{ Ohm}*Iref)=2*$
$(16.6 \text{ Ohm}*24 \text{ mA})=0.8 v$                        4.

The Resistance value is as defined above. Iref is the current level of the current source 223 connected to the source line driver 220 and in this example Iref=24 mA. $V_{ddRx}$ is the voltage level of a power source of the sink line driver 210 and in this example $V_{ddRx}$=3.3V. The Resistance_DC is equivalent to a resistance value of two resistors connected in parallel to the current sources 203 and 204. As noted above, the current source 203 is connected to resistors 211, and 201, and the current source 204 is connected to resistors 212, and 202. In the exemplary and non-limiting FIG. 3, the value of all termination resistors is 50 Ohm, thus the Resistance DC value is 25 Ohm as resistors 201, 211 are connected in parallel and as resistors 202, 212 are connected in parallel. The voltage value (Resistance_DC*Iref/3) is the contribution of the current sources 203 and 204. $V_{SWING}$ is the peak-to-peak voltage level of a single-ended signal and is equal to the (Resistance_AC*Iref) or to $V_H$–$V_L$. $V_{SWING\text{-}DIFF}$ is the peak-to-peak voltage level of a differential signal. The voltage levels $V_{COMMON\text{-}MODE}$, $V_{SWING\_DIFF}$, $V_H$ and $V_L$ in this example can be utilized in a HDMI.

In summary, the voltage levels $V_H$ and $V_L$ of data signals sent from the source line driver 220 to the sink line receiver 210 in the different coupling modes can be programmed by the circuit 200 using the following equations:

$$V_{SWING} = \text{Resistance\_AC} * \text{Iref}; \quad [\text{Equ. 1}]$$

AC-Coupled:

$$V_H = V_{ddRx} + V_{SWING}/2; \quad [\text{Equ. 2}]$$

$$V_L = V_{ddRx} - V_{SWING}/2; \quad [\text{Equ. 3}]$$

DC-Coupled:

$$V_H = V_{ddRx}; \quad [\text{Equ. 4}]$$

$$V_L = V_{ddRx} - V_{SWING} \quad [\text{Equ. 5}]$$

Thus, setting the values of Iref and termination resistors as defined above allows switching between the different coupling modes, thereby allowing support of both coupling modes. In one embodiment, the value of Iref can be programmed by a controller (not shown) that may either be part of the circuit 200 or the source line driver 220. The controller operates to achieve the voltage levels $V_H$ and $V_L$ of data signals according to the coupling type of the sink device and the equations discussed above.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A circuit for switching between an AC-coupled connectivity and a DC-coupled connectivity of a multimedia interface, comprising:
   a first current source connected in series to a first wire of the multimedia interface and a first tap of a first coupling capacitor;
   a first termination resistor connected to the first current source and to the first tap of the first coupling capacitor, wherein the circuit is connected between a source line driver and a sink line receiver of the multimedia interface, the sink line receiver supporting either the AC-coupled connectivity or the DC-coupled connectivity; and
   a controller configured to set the first current source to an off-state to support the AC-coupled connectivity to the sink line receiver and to set the first current source to an on-state to support the DC-coupled connectivity to the sink line receiver, in the sink line receiver being connected to the first tap of the first coupling capacitor and the source line driver being connected to a second tap of the first coupling capacitor.

2. The circuit of claim 1, wherein the controller is further configured to set voltage levels of signals output by the source line driver to voltage levels defined by the multimedia interface.

3. The circuit of claim 2, further comprising:
   a second current source connected to a second wire of the multimedia interface and the first tap of a second coupling capacitor, wherein the first wire and the second wire provide a differential pair; and
   a second termination resistor connected to the second current source and the first tap of the second coupling capacitor.

4. The circuit of claim 3, wherein the controller is configured to set the second current source to an off-state when the coupling connectivity type is set to operate with an AC-coupled multimedia interface.

5. The circuit of claim 3, wherein the controller is configured to turn on the second current source when the coupling connectivity type is set to operate with a DC-coupled multimedia interface.

6. The circuit of claim 3, wherein the source line driver is implemented using at least anyone of: current-mode logic (CML) and a voltage mode (VM), wherein the source line driver includes at least a current source.

7. The circuit of claim 6, wherein when the sink line receiver is set to operate with an AC-coupled multimedia interface, the controller sets the voltage levels of the signals based on a value of a current signal generated by the current source in the source line driver, a voltage source in the sink line receiver, and a resistance value, wherein the resistance value is a function of either the first termination resistor or the second termination resistor, a termination resistor in the sink line receiver, and a termination resistor in the source line driver.

8. The circuit of claim 6, wherein when the sink line receiver is set to operate with a DC-coupled multimedia interface, the voltage levels of the signals are based on a value of a current signal generated by the current source in the source line driver, a voltage source in the sink line receiver, current signals generated by the first and second current sources, and a resistance value, wherein the resistance value is a function of either the first termination resistor or the second termination resistor, a termination resistor in the sink line receiver, and a termination resistor in the source line driver.

9. The circuit of claim 8, wherein the value of the current signal in the source line driver is controlled by the controller.

10. The circuit of claim 3, wherein the multimedia interface is anyone of: a high-definition multimedia interface (HDMI), a DisplayPort, a USB, and a mobile high-definition link (MHL).

11. A source line driver configured to drive multimedia signals of a multimedia interface, comprising:
   a current source;
   a termination resistor connected to the current source; and
   a circuit connected to a coupling capacitor, including a controller configured to switch the circuit between an AC-coupled connectivity and a DC-coupled connectivity to allow compatibility with the multimedia interface of a sink line receiver, wherein the source line driver supports both the AC-coupled connectivity and the DC-coupled connectivity and the sink line receiver supports anyone of the AC-coupled connectivity and the DC-coupled connectivity, wherein the controller causes the circuit to switch to the coupling connectivity type required by the multimedia interface at which the sink line receiver operates.

12. The source line driver of claim 11, wherein the circuit comprises:
   a first current source connected in series to a first wire of the multimedia interface and the coupling capacitor; and
   a first termination resistor connected to the first current source and the coupling capacitor.

13. The source line driver of claim 12, wherein the circuit further comprises:
   a second current source connected in series to a second wire of the multimedia interface and the coupling capacitor, wherein the first wire and the second wire provide a differential pair; and
   a second termination resistor connected to the second current source and the coupling capacitor.

14. The source line driver of claim 11, wherein the controller is further configured to set voltage levels of signals output by the source line driver to a voltage level defined by the multimedia interface.

15. The source line driver of claim 13, wherein the controller switches the coupling connectivity type based on the coupling connectivity type of the multimedia interface.

16. The source line driver of claim 13, wherein each of the second current source and the first current source is at an off-state when the coupling connectivity type is set to operate with an AC-coupled multimedia interface, and wherein each of the second current source and the first current source is at an on-state when the coupling connectivity type is set to operate with an DC-coupled multimedia interface.

17. The source line driver of claim 13, wherein the source line driver is implemented using at least anyone of: current-mode logic (CML) and a voltage mode (VM), wherein the source line driver includes at least a current source.

18. The source line driver of claim 17, wherein when the sink line receiver is set to operate with an AC-coupled multimedia interface, the voltage levels of the signals are set based on a value of a current signal generated by the current source in the source line driver, a voltage source in the sink line receiver, and a resistance value, wherein the resistance value is a function of either the first termination resistor or the second termination resistor, a termination resistor in the sink line receiver, and a termination resistor in the source line driver.

19. The source line driver of claim 17, wherein when the sink line receiver is set to operate with a DC-coupled multimedia interface, the voltage levels of the signals are based on a value of a current signal generated by the current source in the source line driver, a voltage source in the sink line receiver, current signals generated by the first and second current sources, and a resistance value, wherein the resistance value is a function of either the first termination resistor or the second termination resistor, a termination resistor in the sink line receiver, and a termination resistor in the source line driver.

20. The source line driver of claim 18, wherein the multimedia interface is anyone of: a high-definition multimedia interface (HDMI), a DisplayPort, a USB, and a mobile high-definition link (MHL).

* * * * *